United States Patent

[11] 3,627,743

[72] Inventors Ram K. Agnihotri Fishkill; Frank P. Hood, Poughkeepsie; Lewis G. Lesoine, Hopewell Junction, all of N.Y.

[21] Appl. No. 854,680
[22] Filed Sept. 2, 1969
[45] Patented Dec. 14, 1971

[73] Assignee International Business Machines Corporation Armonk, N.Y.

[54] PHOTORESIST POLYMER AND PROCESS FOR ITS PREPARATION
4 Claims, 1 Drawing Fig.

[52] U.S. Cl. .......... 260/89.1, 260/91.3 VA, 96/36.2, 96/115
[51] Int. Cl. .......... C08f 27/00
[50] Field of Search .......... 260/89.1, 92.3 VA

[56] References Cited

UNITED STATES PATENTS 2,725,372 11/1955 Minsk .......... 260/91.3

FOREIGN PATENTS 4,317,582 7/1968 Japan .......... 260/89.1

*Primary Examiner*—Joseph L. Schofer
*Assistant Examiner*—Stanford M. Levin
*Attorneys*—Hanifin and Jancin and David M. Bunnell

ABSTRACT: The resolution of cinnamate photoresist polymers is improved by dissolving the polymers in an inert solvent and treating the dissolved polymer with base such as an alkali metal hydroxide to increase the molecular weight and narrow the molecular weight distribution.

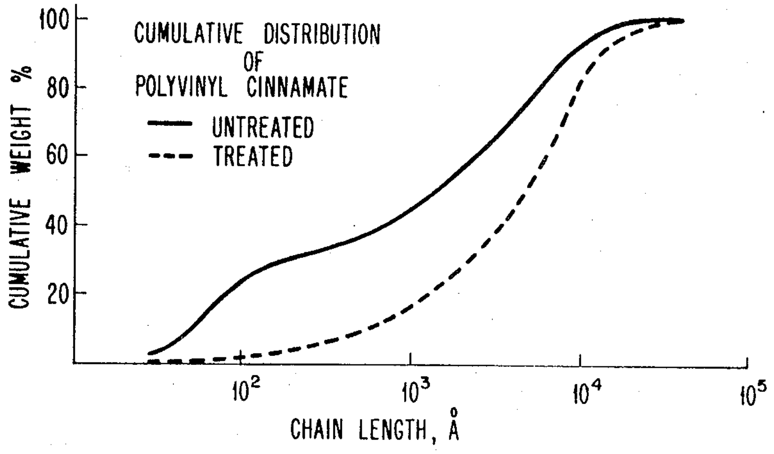
INVENTORS.
RAM K. AGNIHOTRI
FRANK P. HOOD III
LEWIS G. LESOINE
BY David M. Bunnell
ATTORNEY.

PHOTORESIST POLYMER AND PROCESS FOR ITS PREPARATION

BACKGROUND OF THE INVENTION

Photoetching is a well known and useful technique for preparing parts having intricate shapes with extreme accuracy. In the photoetching technique, the part is first coated with a photopolymer or photoresist which is sensitive to and undergoes a change upon exposure to light. For example, certain polymeric esters of cinnamic acid will cross-link and become insoluble upon exposure to light whereas the unexposed portions remain soluble and can be removed to expose the portions of the part which it is desired to etch.

Particularly useful photoresist polymers are esters formed by reacting polymeric alcohols with cinnamoyl chloride. It has been found that certain problems are associated with the use of these polymers in that the lower molecular weight portions of the polymer require relatively longer exposure times to cross-link to the point of insolubility in the developer. Sometimes, even after extended exposure portions of the polymer remain soluble which causes poor resolution of lines between the exposed and unexposed areas and also pinholing in the exposed areas. As a result, a part will not be precisely etched in accordance with the master image to which the resist has been exposed and also, portions of the part which should be completely masked and protected from the etching solution are attacked through the pin holes in the resist.

BRIEF DESCRIPTION

A process has been found to upgrade the photopolymers by reducing the amount of low molecular weight material and providing a polymer having increased average chain length and a narrow distribution of chain lengths.

In accordance with this invention, photoresist polymers comprising polymeric cinnamic acid esters are dissolved in an inert solvent and treated with base. The treated polymer is then recovered from the solvent-base mixture.

DESCRIPTION OF THE DRAWINGS

The drawing is a graph comparing the molecular weight distributions of treated and untreated polymer.

DETAILED DESCRIPTION

The foregoing and other objects, features, and advantages of the invention will be apparent from the following more particular description and examples wherein parts are parts by weight unless otherwise indicated.

The crude photoresist polymers, for example, polyvinyl cinnamate, are conveniently prepared by the reaction of the organic acid chloride with the polymeric alcohol, for example, polyvinyl alcohol. The product is then separated from any unreacted material. It has been found that the products of this reaction contain material having a wide molecular weight distribution and a significant amount of low molecular weight material. The low molecular weight material causes the photoresist polymers to require long exposure times to obtain a cross-linked polymer and even then results in an exposed image having poor resolution between the exposed and unexposed areas. It has only been found possible to remove a relatively small amount of the low molecular weight material by reprecipitation techniques and the problem of low sensitivity, poor resolution and pinholes, although reduced to some extent, still persists. Surprisingly, it has been found that the amount of low molecular weight material is reduced, the molecular weight distribution is narrowed, and the percentage of high molecular weight polymer is dramatically increased by treating a solution of the polymer with base.

In the treatment procedure, any suitable inert solvent can be employed which will dissolve the cinnamate polymer, for example, cyclohexanone, methylene chloride, chlorobenzene, and tetrahydrofuran. Mixtures of solvents can also be employed.

To obtain the novel result of the invention, the dissolved polymer is treated with base. The identity of the base is not particularly critical and both inorganic and organic bases can be employed, for example, alkali metal hydroxides such as sodium and potassium hydroxides; ammonium hydroxide; sodium carbonate; and organic bases such as, for example, n-butylamine and triethylamine. The concentration of base is not critical and the bases are conveniently employed in concentrations of, for example, 2 molar in water.

The process can be carried out at ambient temperatures with agitation. Higher temperatures can be employed, but are not necessary. The treated polymer is conveniently recovered by adding the solution to a liquid in which the polymer is insoluble, for example, methyl alcohol; this precipitates the treated polymer. The polymer is then air dried to remove the residual solvent.

Example IA Polyvinyl cinnamate was prepared by adding 2.75 grams of polyvinyl alcohol (Gelvatol 1–60 product of Monsanto Company) to a flask containing 50 cc. of pyridine. The mixture was heated overnight on a boiling water bath at a mixture temperature of between about 80° and 90° C. After cooling there was then added 12.5 grams of melted cinnamoyl chloride and the flask was heated for 4 hours over a water bath at 50° C. with stirring. The mixture was cooled, 400 cc. of acetone added and the product filtered. The acetone solution was poured into cold water with stirring to precipitate the polyvinyl cinnamate. The dry yield of crude polymer was 9.0 grams. The molecular weight distribution of the crude polymer was determined by gel permeation chromatography. The results obtained are listed in table I below.

Example IB A portion of the crude polyvinyl cinnamate prepared in example IA was treated by dissolving it in chloroform and reprecipitating the polymer into methanol. The polymer was recovered by filtration and air dried. The molecular weight distribution was determined by gel permeation chromatography. The results are listed in table I below.

Example II A gram portion of the crude polyvinyl cinnamate prepared in example IA was dissolved in 25 cc. of methylene chloride after which 13 cc. of cyclohexanone was added with stirring. There was added to the methylene chloride-cylcohexanone solution of polymer, 25 cc. of 2 molar sodium hydroxide in water. The mixture was stirred at room temperature for 4 hours. The treated polymer was recovered by separation and collection of the cylcohexanone methylene chloride layer, followed by its reprecipitation in methanol. After filtration, the polymer was dried by heating in a vacuum oven at 60° C. for 16 hours.

The molecular weight distributions of the polymers were determined by Gel Permeation Chromatography (GPC) (Waters Associates Model 200), using standard polystyrene (Pressure Chemical Co.) for the calibration.

TABLE I.—MOLECULAR WEIGHT DISTRIBUTION OF POLYVINYL CINNAMATES

| Polyvinyl cinnamate | Percent polymer having chains— | | | Weight average (A.) |
|---|---|---|---|---|
| | <$10^3$A. | $10^3$–$10^4$A. | >$10^4$A. | |
| Crude | 58 | 38 | 4 | 3,063 |
| Reprecipitated | 47 | 50 | 3 | 3,557 |
| Base treated | 14 | 66 | 20 | 9,007 |

It can be seen from the results given in table I that reprecipitating the polyvinyl cinnamate from methanol reduced the low molecular weight fraction about 11 percent with a corresponding increase in the medium molecular weight portion. The high molecular weight portion remained essentially constant. The weight average chain length slightly increased from 3,063 to 3,557 A. In contrast to the reprecipitated sample, the base-treated polymer showed a dramatic reduction in low molecular weight material with a corresponding increase in the higher molecular weight portions and a resulting narrowing of the molecular weight distribution. A large increase in the weight average chain length to 9,007 A. was obtained.

The drawing again illustrates the difference by showing the cumulative molecular weight distributions of reprecipitated polyvinyl cinnamate and base-treated polyvinyl cinnamate.

Example III In order to illustrate the improved photoresist characteristics of the polymers prepared by the process of the invention compared with untreated polymers, the following procedure was carried out, utilizing portions of the crude, reprecipitated, and base-treated polyvinyl cinnamates prepared in examples IA and IB and II. 9-percent solutions (by weight) of the polyvinyl cinnamates were prepared in chlorbenzene solvent. Two percent by weight (based on polymer), of a thiazoline type photo initiator was added and the solutions were filtered through a 1.2 micron filter. The solutions were coated on Si-$SiO_2$ wafers by placing about 10 drops of the solution on the surface of the silicone wafers, which were held on a shaft by vacuum, and rotating the shaft at 3,700 r.p.m. for 0.75 minute. The coated wafers were prebaked in an oven for a few minutes at about 100° C., cooled, and then exposed with a negative mask for 6 seconds to ultraviolet light. The wafers were developed for 2½ minutes in Eastman Kodak's KOR developer followed by a ½-minute xylene rinse.

Photos of the developed photoresists were taken at a magnification of 700X with the following results observed. The crude polyvinyl cinnamate produced wavy lines with poor line definition and some pinholing. The reprecipitated polymer was slightly superior with respect to the line definition but waviness of lines and poor resolution was observable. In contrast, the high molecular weight base-treated polymer showed excellent resolution and sharp lines with adequate exposure and no indication of any potential pinholing.

Example IV To illustrate the use of other bases in the process of the invention, portions of crude polyvinyl cinnamate prepared in accordance with the procedure of example IA were treated with a variety of bases using the procedure of example II with the exception that cyclohexanone rather than a cyclohexanone-methylene chloride solvent mixture was employed. The concentration and identity of the bases are given in table II below. The weight average chain lengths of the treated polymers portions were determined by GPC with the results being listed in table II.

The results listed in table II demonstrate that a variety of bases can be used to upgrade the molecular weight characteristics of the polyvinyl cinnamates.

TABLE II

| Base | of base moles/ liter | Weight Average A. |
|---|---|---|
| NaOH | 2 | 9,100 |
| KOH | 2 | 9,200 |
| $Na_2CO_3$ | 0.25 | 9,100 |
| $NH_4OH$ | 2 | 8,800 |
| $CH_3(CH_2)_2\ CH_2\ NH_2$ | 2 | 8,100 |
| $(CH_3{-}CH_2)_3N$ | 25 ml.* | 9,035 |

*Twenty five ml. of triethyl amine was used with 1 gram polyvinyl cinnamate solution in 38 ml. of cyclohexanone.

The foregoing has described a process which surprisingly and dramatically improves the molecular weight characteristics of the cinnamate polymer photoresists. While the exact mechanism of this improvement is not known, the resulting polymers, because of this increased molecular weight and relatively narrow molecular weight distribution, give photoresist polymers having improved resolution and excellent sensitivity. It has also been noted that the polymers prepared by the process of the invention are easier to coat on the substrates to produce a uniform coating.

While the invention has been particularly shown and described with reference to preferred embodiments thereof, it will be understood by those skilled in the art that the foregoing and other changes in form and details may be made therein without departing from the spirit and scope of the invention.

We claim:

1. A process of increasing the molecular weight and narrowing the molecular weight distribution of polyvinyl cinnamate photoresist polymers comprising:

Dissolving a polyvinyl cinnamate polymer, a major portion of which has a weight average chain length of less than $10^3$ A. as determined by Gel Permeation Chromatography, in a mixture of inert solvent and base, said base being selected from the group consisting of inorganic bases and aliphatic organic amines, agitating said mixture, and precipitating the treated polymer from said mixture a major portion of said polymer having an average chain length greater than $10^3$ A. as determined by Gel Permeation Chromatography.

2. The process of claim 1 wherein said base is n-butylamine.

3. The process of 1 wherein said base is an alkali metal hydroxide.

4. The process of claim 1 wherein said base is sodium carbonate.

* * * * *